US010333008B2

(12) United States Patent
Jiang et al.

(10) Patent No.: US 10,333,008 B2
(45) Date of Patent: Jun. 25, 2019

(54) SUBSTRATES HAVING AN ANTIREFLECTION LAYER AND METHODS OF FORMING AN ANTIREFLECTION LAYER

(71) Applicant: University of Florida Research Foundation, Inc., Gainesville, FL (US)

(72) Inventors: Peng Jiang, Ganesville, FL (US); Khalid Askar, Gainesville, FL (US); Jiamin Wang, Gainesville, FL (US); Christopher Kim, Tallahassee, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 106 days.

(21) Appl. No.: 15/033,142

(22) PCT Filed: Oct. 30, 2014

(86) PCT No.: PCT/US2014/063163
§ 371 (c)(1),
(2) Date: Apr. 29, 2016

(87) PCT Pub. No.: WO2015/116267
PCT Pub. Date: Aug. 6, 2015

(65) Prior Publication Data
US 2016/0254395 A1 Sep. 1, 2016

Related U.S. Application Data

(60) Provisional application No. 61/897,961, filed on Oct. 31, 2013.

(51) Int. Cl.
H01L 31/18 (2006.01)
H01L 31/0216 (2014.01)
H01L 31/0236 (2006.01)

(52) U.S. Cl.
CPC .. H01L 31/02168 (2013.01); H01L 31/02366 (2013.01); H01L 31/1804 (2013.01); H01L 31/184 (2013.01); Y02E 10/50 (2013.01)

(58) Field of Classification Search
CPC .................... H01L 31/02168; H01L 31/02366
See application file for complete search history.

(56) References Cited

U.S. PATENT DOCUMENTS

2009/0274873 A1* 11/2009 Shinotsuka ............ B82Y 10/00
428/143
2011/0194261 A1* 8/2011 Tanaka ................... B32B 17/04
361/748

(Continued)

OTHER PUBLICATIONS

W. L. Min, B. Jiang, P. Jiang, "Bioinspired Self-Cleaning Antireflection Coatings", Adv. Mater. 20 (2008) 3914-3918.

(Continued)

Primary Examiner — Mohsen Ahmadi
Assistant Examiner — Christopher M Roland
(74) Attorney, Agent, or Firm — Thomas Horstemeyer, LLP

(57) ABSTRACT

Embodiments of the present disclosure provide for methods of making substrates having an antireflective layer, substrates having an antireflective layer, devices including a substrate having an antireflective layer, and the like.

15 Claims, 14 Drawing Sheets

Pillars Generated From 100 nm SiO₂ Coating

Pillars Generated From 200 nm SiO₂ Coating

Pillars Generated From 300 nm SiO₂ Coating

Pillars Generated From 400 nm SiO₂ Coating

(56) References Cited

U.S. PATENT DOCUMENTS

| | | | |
|---|---|---|---|
| 2012/0051489 A1 | 3/2012 | Varanasi et al. | |
| 2012/0225517 A1 | 9/2012 | Zhang et al. | |
| 2012/0281292 A1 | 11/2012 | Baca et al. | |
| 2012/0321810 A1 | 12/2012 | Tebby et al. | |

OTHER PUBLICATIONS

D.G. Stavenga, S. Foletti, G. Palasantzas, K. Arikawa, "Light on the moth-eye corneal nipple array of butterflies", Proc. R. Soc. B 273 (2006) 661-667.

E. Metwalli, D. Haines, O. Becker, S. Conzone, C.G. Pantano, "Surface characterizations of mono-, di-, and tri-aminosilane treated glass substrates", J. Colloid Interf. Sci. 298 (2006) 825-831.

S. Lu, A. Bansal, W. Soussou, T.W. Berger, A. Madhukar, "Receptor-Ligand-Based Specific Cell Adhesion on Solid Surfaces: Hippocampal Neuronal Cells on Bilinker Functionalized Glass", Nano Lett. 6 (2006) 1977-1981.

B.T. Liu, Y.T. Teng, "A novel method to control inner and outer haze of an anti-glare film by surface modification of light-scattering particles", J. Colloid Interf. Sci. 350 (2010) 421-426.

International Search Report for PCT/US2014/063163 dated Jun. 25, 2015.

S. Walheim, E. Schaffer, J. Mlynek, U. Steiner, "Nanophase-Separated Polymer Films as High-Performance Antireflection Coatings", Science 283 (1999) 520-522.

A. Gombert, W. Glaubitt, K. Rose, J. Dreibholz, B. Bläsi, A. Heinzel, D. Sporn, W. Döll, V. Wittwer, "Subwavelength-structured antireflective surfaces on glass", Thin Solid Films 351 (1999) 73-78.

C. Heine, R.H. Morf, "Submicrometer gratings for solar energy applications", Appl. Opt. 34 (1995) 2476-2482.

M. Ibn-Elhaj, M. Schadt, "Optical polymer thin films with isotropic and anisotropic nano-corrugated surface topologies", Nature 410 (2001) 796-799.

A. Gombert, B. Blasi, C. Buhler, P. Nitz, J. Mick, W. Hossfeld, M. Niggemann, "Some application cases and related manufacturing techniques for optically functional microstructures on large areas", Opt. Eng. 43 (2004) 2525-2533.

J.A. Hiller, J.D. Mendelsohn, M.F. Rubner, "Reversibly erasable nanoporous anti-reflection coatings from polyelectrolyte multilayers", Nat. Mater. 1 (2002) 59-63.

U. Schulz, "Review of modem techniques to generate antireflective propoerties on thermoplastic polymers", Appl. Opt. 45 (2006) 1608-1618.

B.E. Yoldas, D.P. Partlow, "Formation of Broad Band Antireflective Coatings on Fused Silica for High Power Laser Applications", Thin Solid Films 129 (1985) 1-14.

D. Chen, "Anti-reflection (AR) coatings made by sol-gel processes: A review", Sol. Energ. Mater. Sol. C. 68 (2001) 313-336.

M.F. Schubert, F.W. Mont, S. Chhajed, D.J. Paxson, J.K. Kim, E.F. Schubert, "Design of multilayer antireflection coatings made from co-sputtered and low-refractive-index materials by genetic algorithm", Opt. Exp. 16 (2008) 5290-5298.

H Nagel, A. Metz, R. Hezel, "Porous SiO2 films prepared by remote plasma-enhanced chemical vapour deposition—a novel antireflection coating technology for photovoltaic modules", Sol. Energ. Mater. Sol. C. 65 (2001) 71-77.

A. Luque, S. Hegedus, Handbook of Photovoltaic Science and Engineering. John Wiley & Sons, West Sussex, 2003, 115 pages.

M. Sakhuja, J. Son, L.K. Verma, H. Yang, C.S. Bhatia, A.J. Danner, "Omnidirectional study of nanostructured glass packaging for solar modules", Prog. Photovol. 22 (2014) 356-361.

H.A. Macleod, Thin-Film Optical Filters. Third ed., Institute of Physics Publishing, Bristol, 2001, 666 pages.

C.M. Kennemore Iii, U.J. Gibson, "Ion beam processing for coating MgF2 onto ambient temperature substrates", Appl. Opt. 23 (1984) 3608-3611.

D. Lee, M.F. Rubner, R.E. Cohen, "All-Nanoparticle Thin-Film Coatings", Nano Lett. 6 (2006) 2305-2312.

M. Kursawe, R. Anselmann, V. Hilarius, G. Pfaff, "Nano-Particles by Wet Chemical Processing in Commercial Applicaitons", J. Sol-Gel Sci. Technol. 33 (2005) 71-74.

Y. Zhao, J.S. Wang, G.Z. Mao, "Colloidal subwavelength nanostructures for antireflection optical coatings", Opt. Lett. 30 (2005) 1885-1887.

D. Lee, Z. Gemici, M.F. Rubner, R.E. Cohen, "Multilayers of Oppositely Charged SiO2 Nanoparticles: Effect of Surface Charge on Multi9layer Assembly", Langmuir 23 (2007) 8833-8837.

K. Askar, B.M. Phillips, X. Dou, J. Lopez, C. Smith, B. Jiang, P. Jiang, "Self-assembled nanoparticle antiglare coatings", Opt. Lett. 37 (2012) 4380-4382.

H. Shimomura, Z. Gemici, R.E. Cohen, M.F. Rubner, "Layer-by-Layer-Assembled High-Performance Broadband Antireflection Coatings", ACS Appl. Mater. Interface 2 (2010) 813-820.

H.Y. Koo, D.K. Yi, S.J. Yoo, D.Y. Kim, "A Snowman-like Array of Colloidal Dimers for Antireflecting Surfaces", Adv. Mater. 16 (2004) 274-277.

T. Lohmueller, M. Helgert, M. Sundermann, R. Brunner, J.P. Spatz, "Biomimetic Interfaces for High-Performance Optics in the Deep-UV Light Range", Nano Lett. 8 (2008) 1429-1433.

M.S. Park, J.K. Kim, "Porous Structures of Polymer Films Prepared by Spin Coating with Mixed Solvents under Humid Condition", Langmuir 22 (2006) 4594-4598.

B.-T. Liu, Y.-T. Teng, R.-H. Lee, W.-C. Liaw, C.-H. Hsieh, "Strength of the interactions between light-scattering particles and resins affects the haze of anti-glare films", Colloid Surf. A 389 (2011) 138-143.

J.Q. Xi, M.F. Schubert, J.K. Kim, E.F. Schubert, M. Chen, S.-Y. Lin, LiuW, J.A. Smart, "Optical thin-film materials with low refractive index for broadband elimination of Fresnel reflection", Nat. Photon. 1 (2007) 176-179.

G.M. Nogueira, D. Banerjee, R.E. Cohen, M.F. Rubner, "Spray-Layer-by-Layer Assembly Can More Rapidly Produce Optical-Quality Multistack Heterostructures", Langmuir 27 (2011) 7860-7867.

C.S. Thompson, R.A. Fleming, M. Zou, "Solar Energy Materials & Solar Cells", Sol Energ Mater Sol C 115 (2013) 108-113.

G. Zhou, J. He, J. "Antireflective coatings on Fresnel lenses by spin-coating of solid silica nanoparticles", Nanosci. Nanotechnol. 13 (2013) Abstract.

J.-H. Kim, S. Fujita, S. Shiratori, "Design of a thin film for optical applications, consisting of high and low refractive index multilayers, fabricated by a layer-by-layer self-assembly method", Colloid Surf. Aspects 284-285 (2006) 290-294.

M.I. Dafinone, G. Feng, T. Brugarolas, K.E. Tettey, D. Lee, "Mechanical Reinforcement of Nanoparticle Thin Films Using Atomic Layer Deposition", ACS Nano 5 (2011) 5078-5087.

B.G. Prevo, E.W. Hon, O.D. Velev, "Assembly and characterization of colloid-based antireflective coatings on multicrystalline silicon solar cells", J. Mater. Chem. 17 (2007) 791-799.

B.G. Prevo, O.D. Velev, "Controlled, Rapid Deposition of Structured Coatings from Micro- and Nanoparticle Suspensions", Langmuir 20 (2004) 2099-2107.

H. Jiang, K. Yu, Y.C. Wang, "Antireflective structures via spin casting of polymer latex", Opt. Lett. 32 (2007) 575-577.

B.T. Liu, W.D. Yeh, "Reflective properties of nanoparticle-arrayed surfaces", Thin Solid Films 518 (2010) 6015-6021.

B.T. Liu, W.D. Yeh, "Antireflective surface fabricated from colloidal silica nanoparticles", Colloid Surf. A 356 (2010) 145-149.

A. Deak, I. Szekely, E. Kalman, Z. Keresztes, A.L. Kovacs, Z. Horvolgyi, "Nanostructured silica Langmuir-Blodgett films with antireflective properties prepared on glass substrates", Thin Solid Films 484 (2005) 310-317.

A. Deak, B. Bancsi, A.L. Toth, A.L. Kovacs, Z. Horvolgyi, "Complex Langmuir-Blodgett films from silica nanoparticles: An optical spectroscopy study", Colloid Surf. A 278 (2006) 10-16.

K.M. Yeung, W.C. Luk, K.C. Tam, C.Y. Kwong, M.A. Tsai, H.C. Kuo, A.M.C. Ng, A.B. Djurisic, "2-Step self-assembly method to fabricate broadband omnidirectional antireflection coating in large scale", Sol Energ Mater Sol C 95 (2011) 699-703.

X. Li, O. Niitsoo, A. Couzis, "Electrostatically driven adsorption of silica nanoparticles on functionalized surfaces", J. Colloid Interf. Sci. 394 (2013) 26-35.

(56) References Cited

OTHER PUBLICATIONS

X. Li, O. Niitsoo, A. Couzis, "Experimental studies on irreversibility of electrostatic adsorption of silica nanoparticles at solid-liquid interface", J. Colloid Interf. Sci. 420 (2014) 50-56.

H. Fudouzi, M. Kobayashi, N. Shinya, "Assembly of Microsized Colloidal Particles on Electrostatic Regions Patterned through Ion Beam Irradiation", Langmuir 18 (2002) 7648-7652.

Y. Masuda, M. Itoh, T. Yonezawa, K. Koumoto, "Low-Dimensional Arrangement of SiO2 Particles", Langmuir 18 (2002) 4155-4159.

J. Tien, A. Terfort, G.M. Whitesides, "Microfabrication through Electrostatic Self-Assembly", Langmuir 13 (1997) 5349-5355.

S. Degand, G. Lamblin, C.C. Dupont-Gillain, "Colloidal lithography using silica particles: Improved particle distribution and tunable welling properties", J. Colloid Interf. Sci. 392 (2013) 219-225.

J. Aizenberg, P.V. Braun, P. Wiltzius, "Patterned Colloidal Deposition Controlled by Electrostatic and Capillary Forces", Phys. Rev. Lett. 84 (2000) 2997-3000.

X.T. Zhang, O. Sato, M. Taguchi, Y. Einaga, T. Murakami, A. Fujishima, "Self-Cleaning Particle Coating with Antireflection Properties", Chem. Mater. 17 (2005) 696-700.

W. Stober, A. Fink, E. Bohn, "Controlled Growth of Monodisperse Silica Spheres in the Micron Size Range", J. Colloid Interf. Sci. 26 (1968) 62-69.

S.P. Pack, N.K. Kamisetty, M. Nonogawa, K.C. Devarayapalli, K. Ohtani, K. Yamada, Y. Yoshida, T. Kodaki, K. Makino, "Direct immobilization of DNA oligomers onto the amine-functionalized glass surface for DNA microarray fabrication through the activation-free reaction of oxanine", Nucleic Acids Res. 35 (2007), 10 pages.

M.G. Moharam, D.A. Pommel, E.B. Grann, T.K. Gaylord, "Stable implementation of the rigorous coupled-wave analysis for surface-relief gratings: enhanced transmittance matrix approuch", J. Opt. Soc. Am. A 12 (1995) 1077-1086.

\* cited by examiner

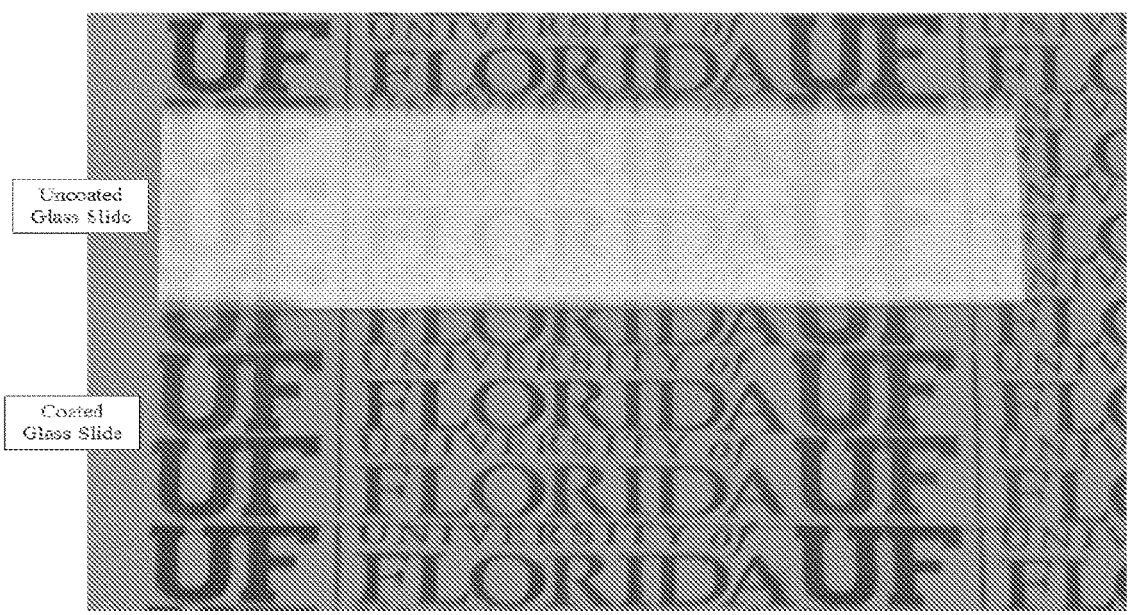
FIG. 1.1

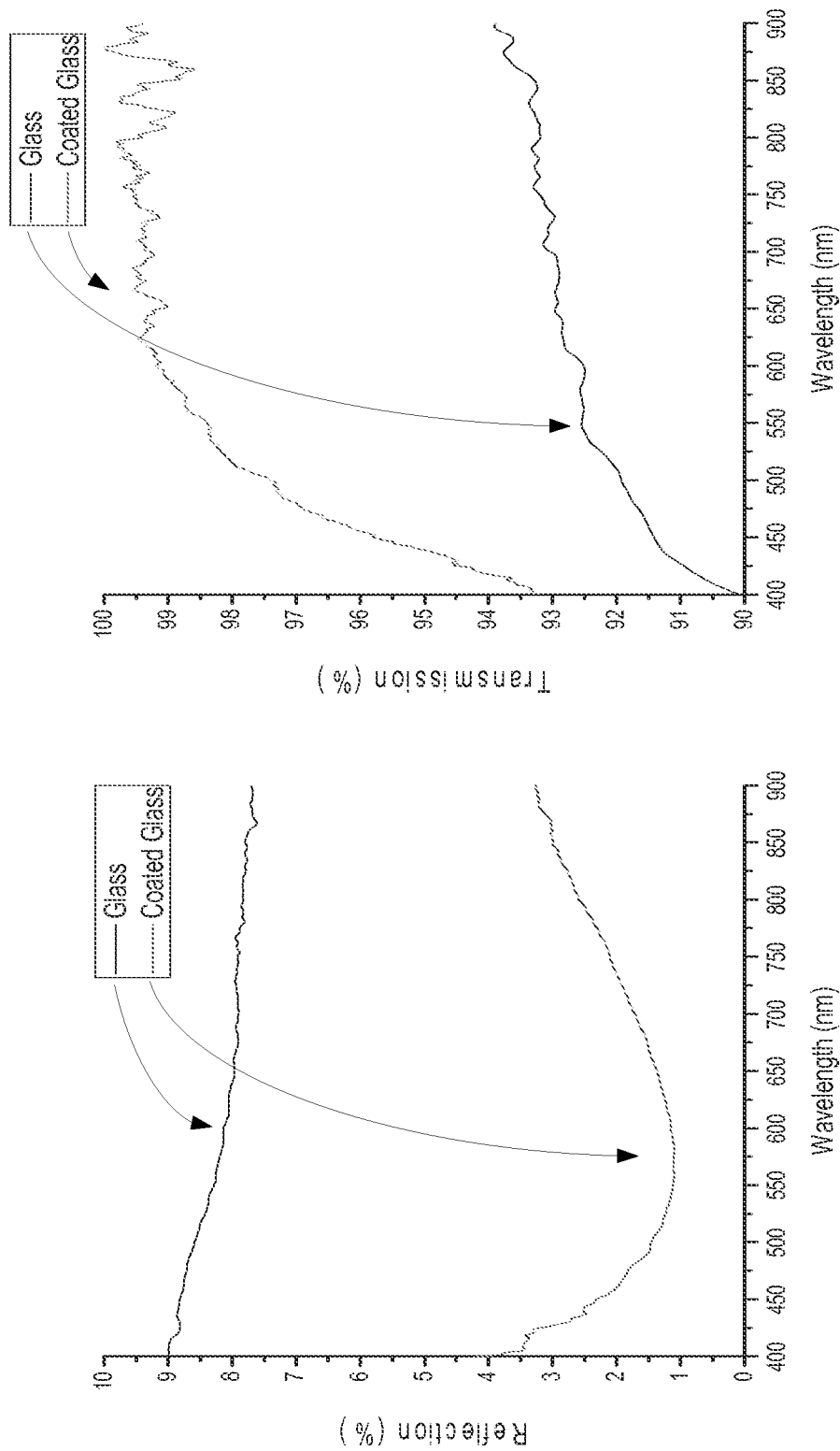
FIG. 1.2

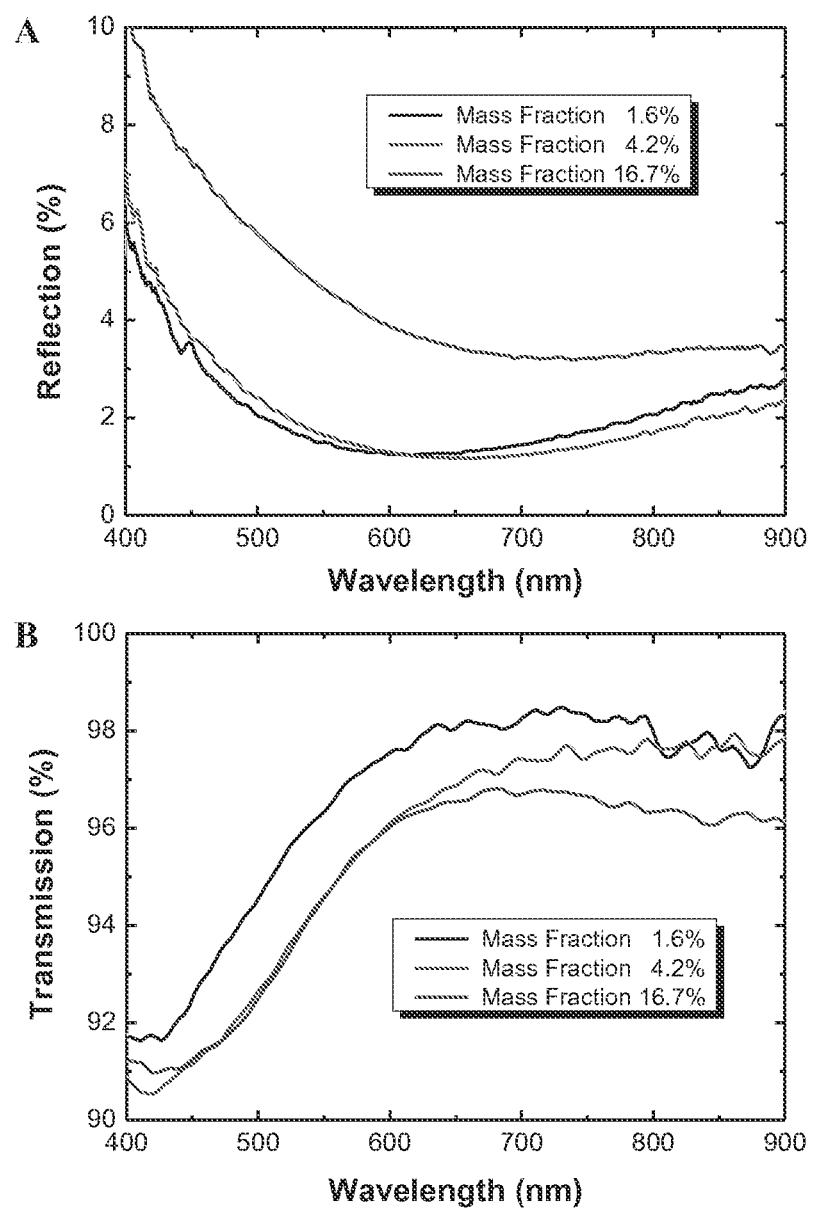
FIG. 1.3

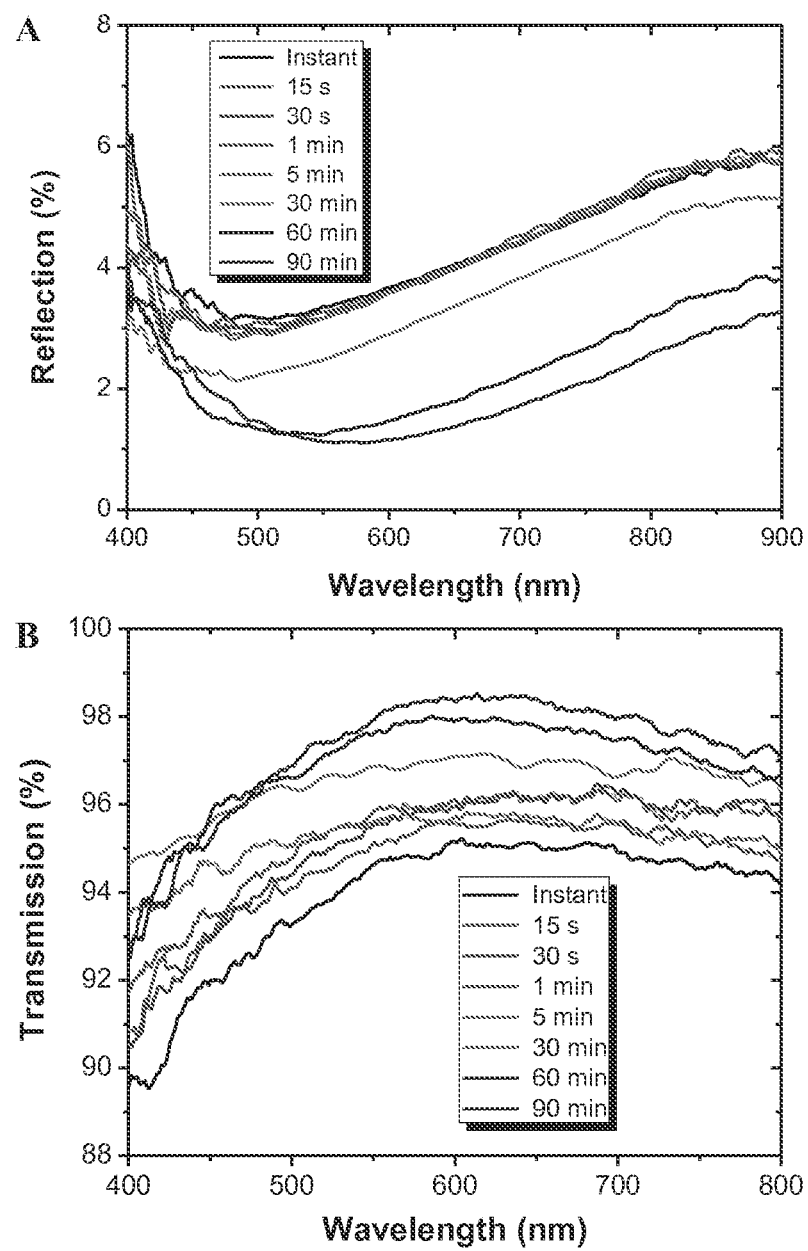
FIG. 1.4

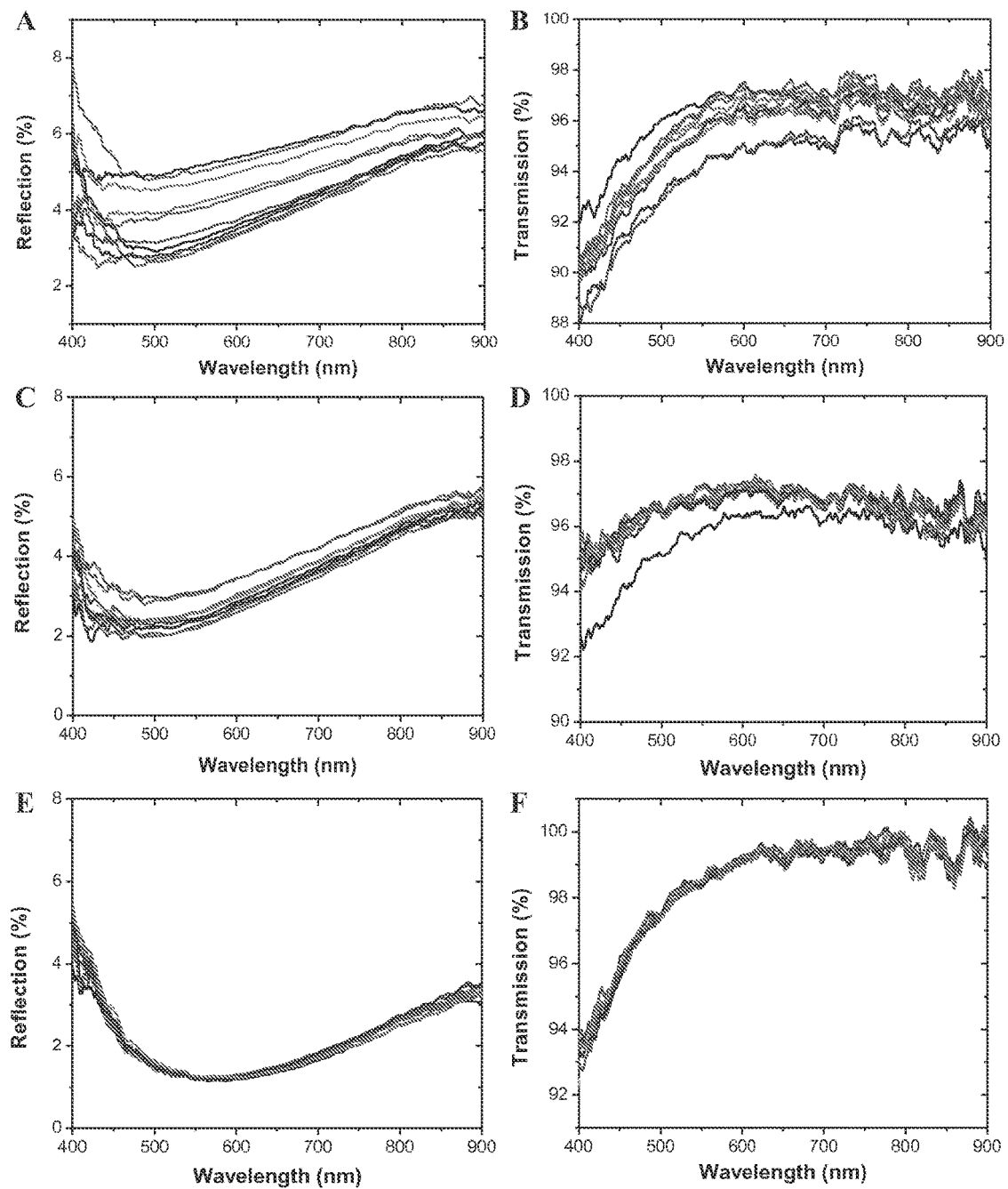
FIG. 1.5

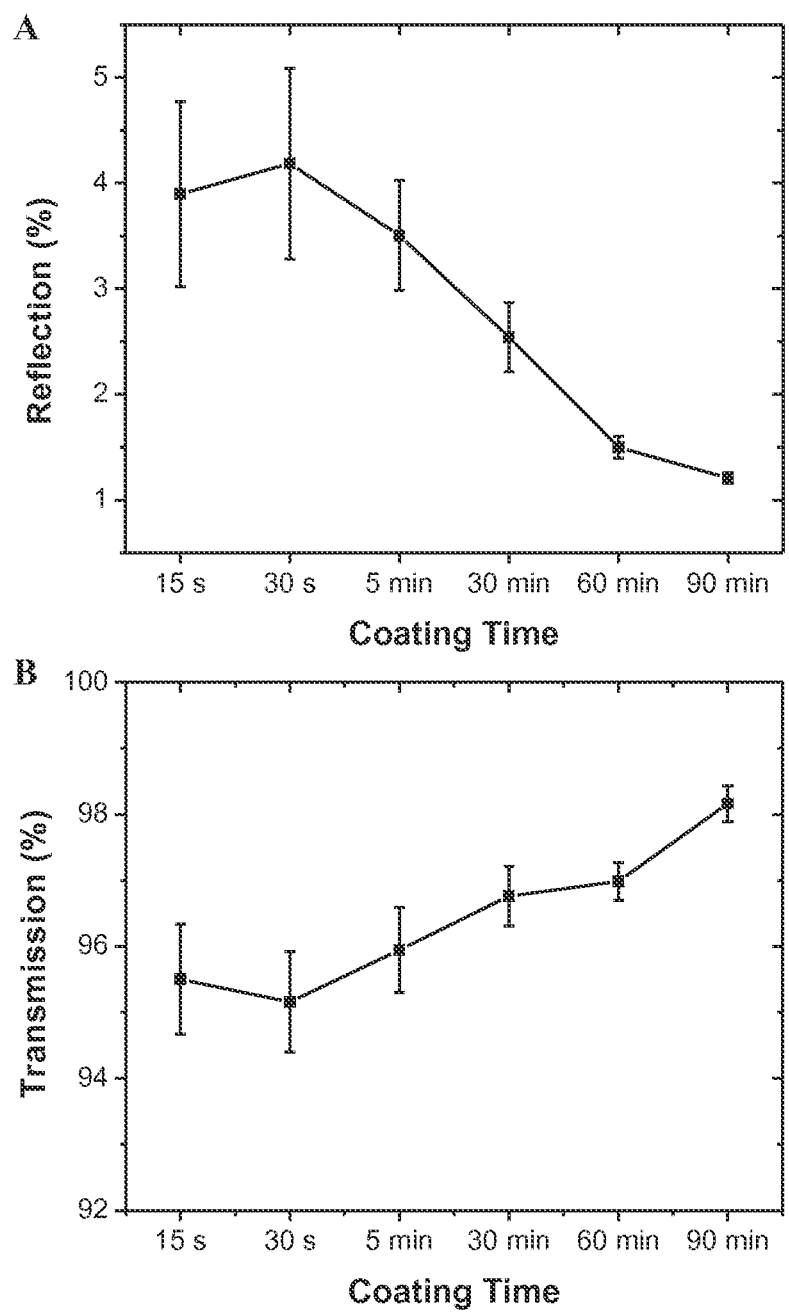
FIG. 1.6

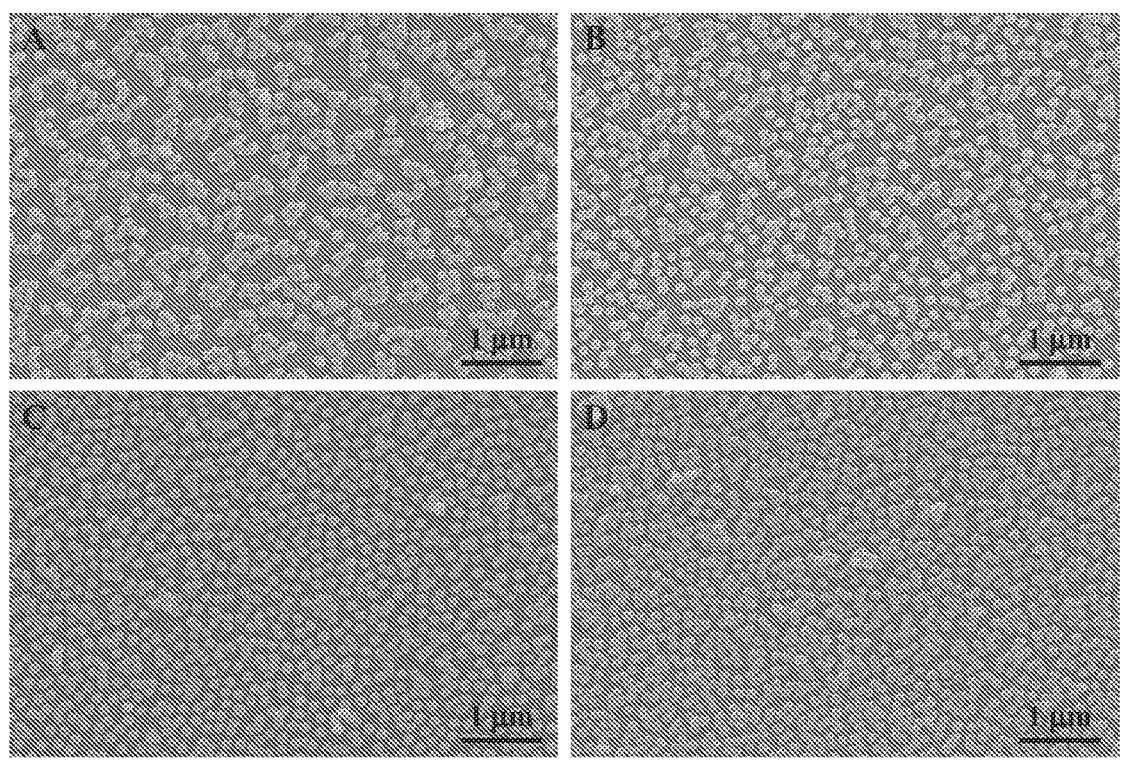
FIG. 1.7

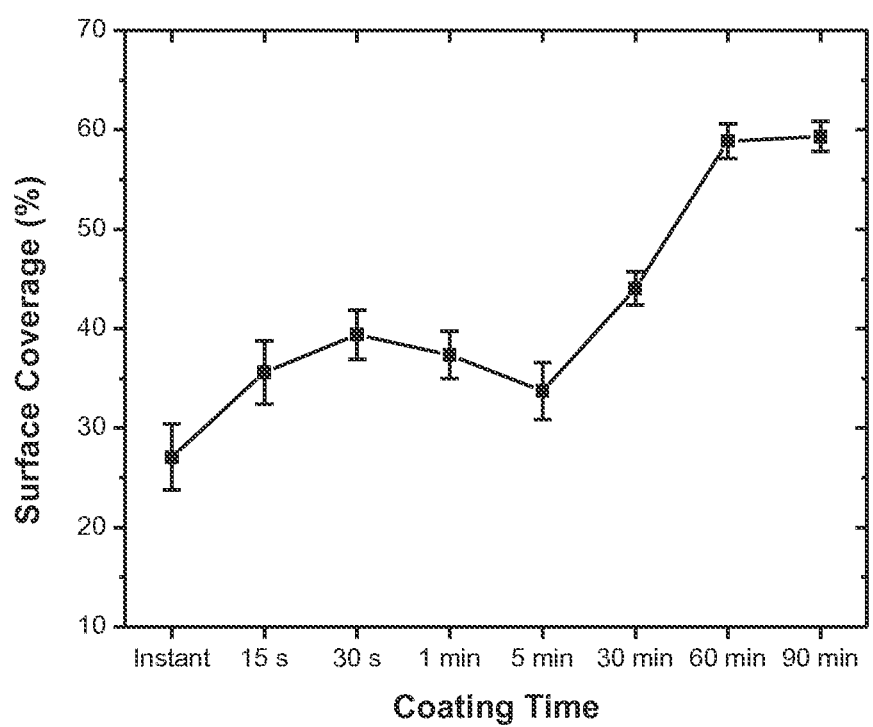
FIG. 1.8

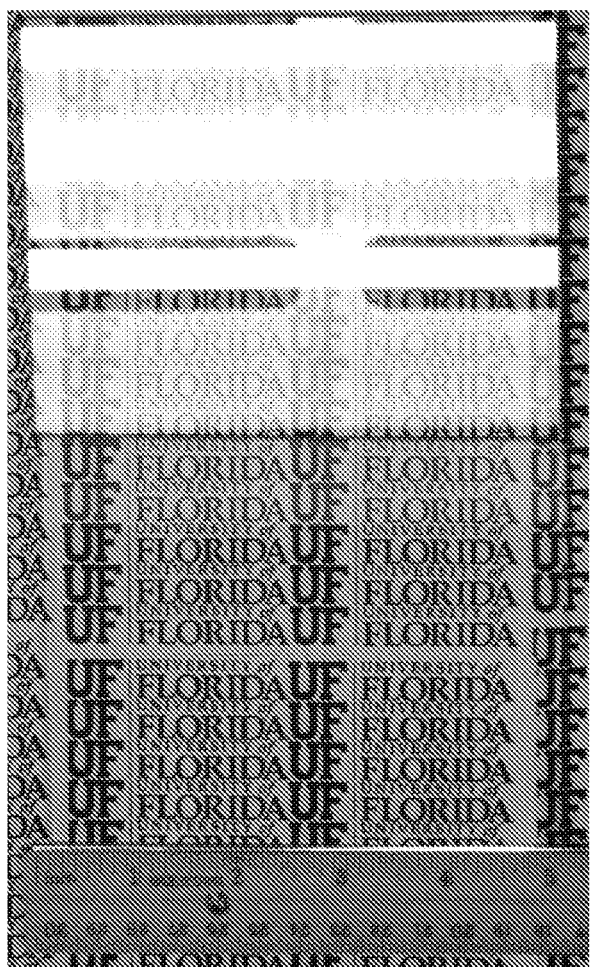
FIG. 1.9

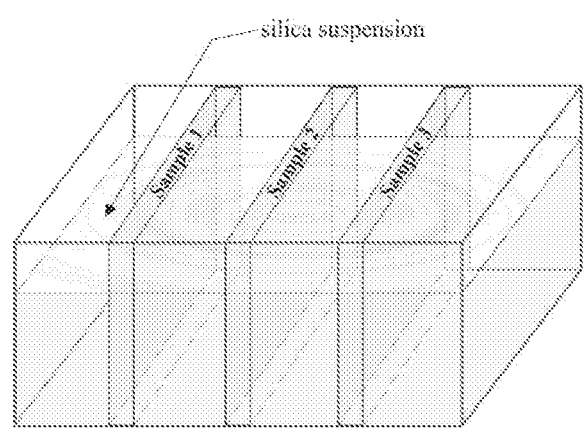
FIG. 1.10

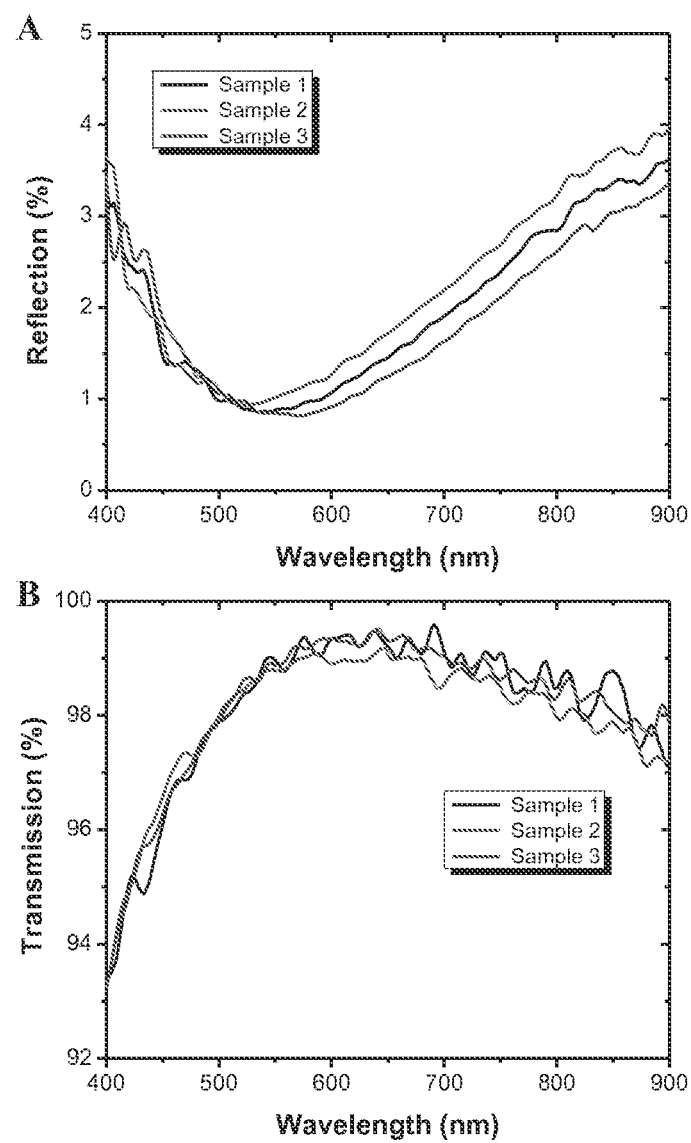
FIG. 1.11

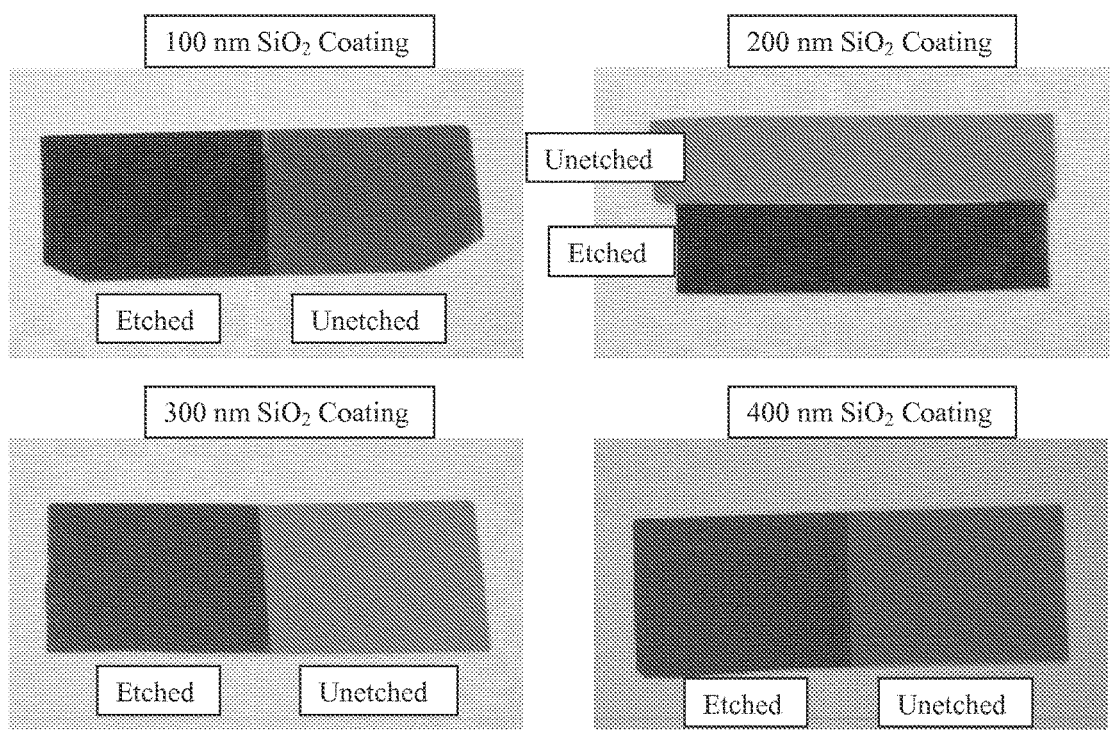
FIG. 1.12

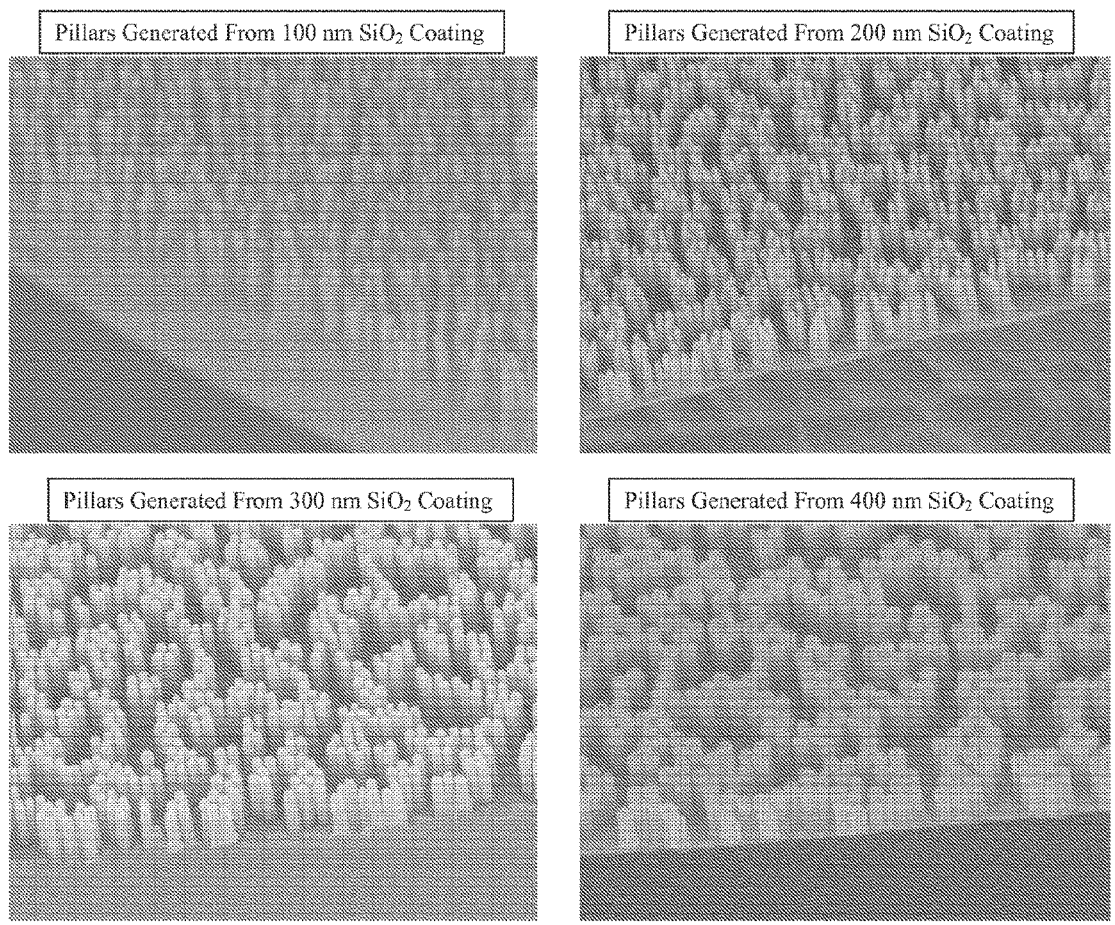
FIG. 1.13

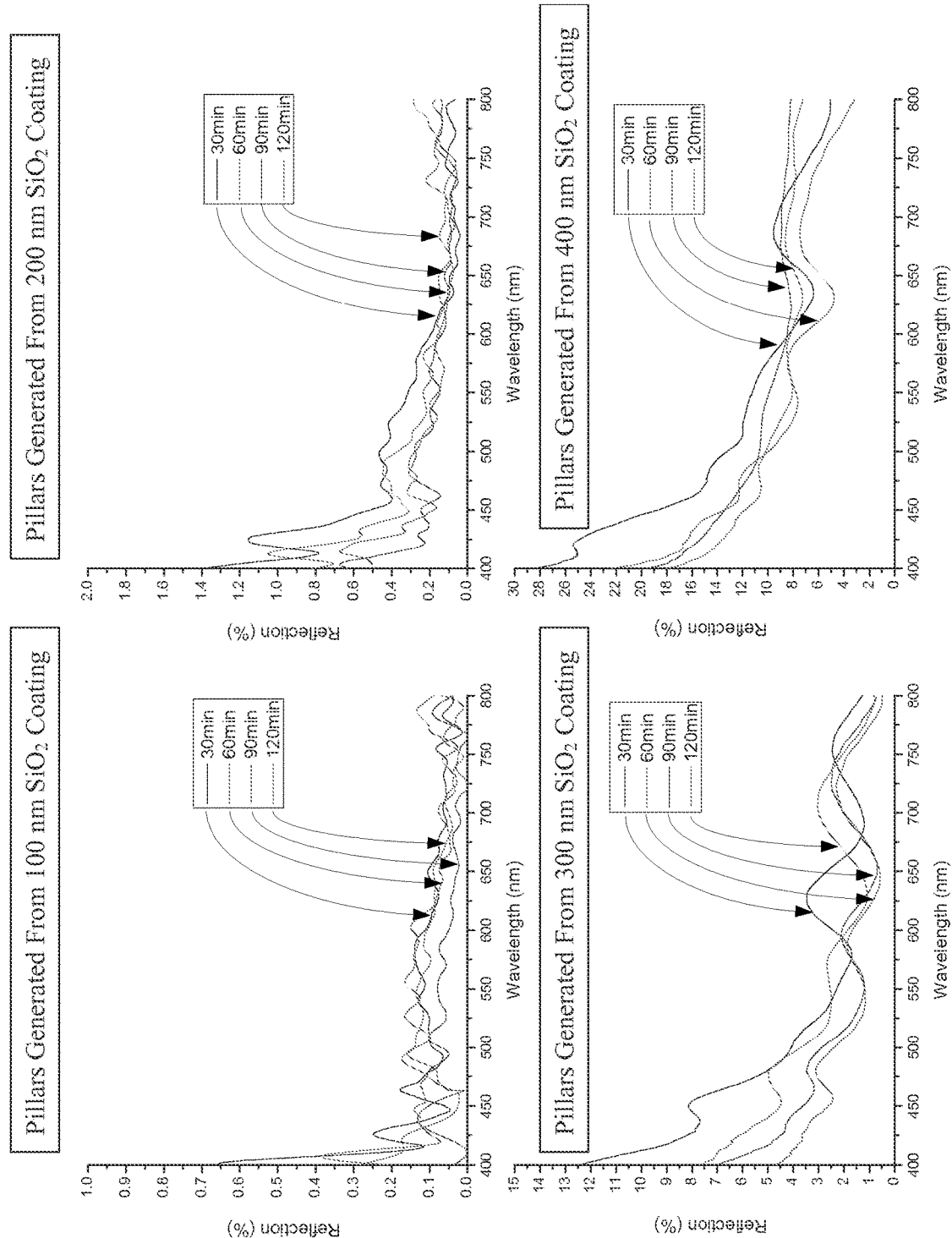
FIG. 1.14

SUBSTRATES HAVING AN ANTIREFLECTION LAYER AND METHODS OF FORMING AN ANTIREFLECTION LAYER

CLAIM OF PRIORITY TO RELATED APPLICATION

This application is the 35 U.S.C. § 371 national stage application of PCT Application No. PCT/US2014/063163, filed Oct. 30, 2014, which claims priority to U.S. provisional application entitled "SUBSTRATES HAVING AN ANTIREFLECTION LAYER AND METHODS OF FORMING AN ANTIREFLECTION LAYER" having Ser. No. 61/897,961, filed on Oct. 31, 2013, both of which are entirely incorporated herein by reference.

FEDERAL SPONSORSHIP

This invention was made with Government support under NNX14AB07G awarded by the National Aeronautics and Space Administration, and Contract/Grant No. CMMI-1000686 awarded by the National Science Foundation. The Government has certain rights in the invention.

BACKGROUND

Anti-glare (or antireflection) coatings on transparent substrates (e.g., glass) are important components for a large number of optical and optoelectronic devices, such as displays, lenses, and photovoltaic (PV) panels [1-10]. For instance, the unwanted optical reflection from the encapsulation glass layer of a PV panel could reduce the overall conversion efficiency of the solar device [11-13]. Anti-glare coatings are therefore widely applied on optical glass surfaces to reduce the reflection loss and increase the light transmission of the optical components [1,14]. Traditional quarter-wavelength antireflection coatings can effectively suppress optical reflection by satisfying the destructive interference conditions for the reflected light from the air/coating and the coating/substrate interfaces, thus decreasing the reflection and increasing the transmission of the substrate [14]. To satisfy the destructive interference conditions, the coating thickness needs to be close to one-fourth of the operating wavelength, while the refractive index of the coating ($n_c$) needs to meet $n_c=\sqrt{n_{air} \times n_s}$, when $n_{air}$ is the refractive index of air (1.0) and $n_s$ is the refractive index of the substrate [6,14]. For a typical glass substrate with a refractive index of 1.5, the anti-glare coating material needs to have a refractive index of ~1.225. Low-refractive-index materials, such as $MgF_2$ (with a refractive index of ~1.37), are usually deposited on glass substrates by vacuum-based physical vapor deposition (PVD) technologies (e.g., sputtering) to achieve a precise control over the coating thickness [14-15]. Unfortunately, conventional PVD techniques suffer from high operating and equipment costs, limited material selection, low throughput, and small coating areas. These drawbacks particularly affect the applications where inexpensive anti-glare coatings on large-area glass substrates are needed, such as in solar industry.

To address the high costs and the low throughput issues of the vacuum-deposited anti-glare coatings, various simple solution processing technologies have been developed [1, 6, 16-25]. In many of these methods, nanoporous coatings with a large fraction of entrapped air and thus a low effective refractive index, which could satisfy the aforementioned ideal quarter-wavelength refractive index requirement, were extensively explored [1, 6, 16, 21, 26]. For example, nanoporous polymer coatings created by phase separation of spin-coated polymer blends, followed by selective removal of one component, have been demonstrated to show good anti-glare performance on glass substrates [1]. Multilayer silica nanoparticle coatings on glass substrates applied through common spin, dip, or roller coating techniques have already been commercialized for improving the efficiencies of PV panels (e.g., Honeywell's SOLARC $R^{PV}$ products) [27-29]. Electrostatics-assisted layer-by-layer (LBL) deposition of nanoparticles and polyelectrolyte multilayers is another popular approach in assembling anti-glare coatings on a variety of substrates [21, 30-31]. Monolayers of colloidal nanoparticles created by convective self-assembly [32-33], spin-coating [18, 29, 34-36], or Langmuir-Blodgett deposition [20, 37-38] have also been widely utilized as antireflection coatings on silicon and glass substrates. However, many of these existing wet-processing technologies involve multiple steps (e.g., LBL assembly) [19], are limited to single-sided coatings on planar substrates (approaches involving spin coating) [18], are not very reproducible over large areas [20], and/or are not inherently parallel for industry-scale manufacturing [32]. Thus, there is a need to overcome these deficiencies.

SUMMARY

Embodiments of the present disclosure provide for methods of making substrates having an antireflective layer, substrates having an antireflective layer, devices including a substrate having an antireflective layer, and the like.

An embodiment of the present disclosure includes a method of forming an antireflective layer on a substrate, among others, that includes: disposing a substrate in a solution, wherein the front side and back side of the substrate are functionalized to have a net positive charge, wherein the solution includes silica nanoparticles; exposing the solution to shaking; and forming, simultaneously, a uniform monolayer of silica nanoparticles on the front side and the back side of the substrate through electrostatic attraction of the silica nanoparticles and the functionalized surfaces of the substrate. An embodiment of the present disclosure also includes: etching the substrate to form an antireflective layer that has a height of about 500 nm to 2000 nm, wherein the antireflective layer includes a plurality of pillars that have a spacing of about 10 nm to 300 nm between a pair of pillars as measured from the pillar base to pillar base, and wherein the pillars have a height of about 100 to 2000 nm.

An embodiment of the present disclosure includes a structure formed from the process, among others, that includes: disposing a substrate in a solution, wherein the front side and back side of the substrate are functionalized to have a net positive charge, wherein the solution includes silica nanoparticles; exposing the solution to shaking; and forming, simultaneously, a uniform monolayer of silica nanoparticles on the front side and the back side of the substrate through electrostatic attraction of the silica nanoparticles and the functionalized surfaces of the substrate.

An embodiment of the present disclosure includes a structure, among others, that includes: a coated substrate having a front side and a back side, wherein the front side and the back side have a monolayer of silica nanoparticles disposed on the surface of the substrate, wherein the light reflected is about 0.5 to 4% over a wavelength of about 400 nm to 800 nm for the coated substrate, wherein the light transmission is about 99% or more over a wavelength of about 500 to 650 nm for the coated substrate.

An embodiment of the present disclosure includes a structure, among others, that includes: a substrate having an antireflective layer that has a total specular reflection of about 2% or less for the entire visible wavelength at an incident angle of about 0° to 90°.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

FIG. 1.1 illustrates a comparison between an uncoated glass slide and a coated glass slide.

FIG. 1.2 shows the measured normal incidence reflection spectra and the normal incidence transmission spectra.

FIGS. 1.3A and 1.3B illustrate two-sided specular reflection (FIG. 1.3A) and transmission (FIG. 1.3B) spectra comparing anti-glare coatings resulting from different mass fractions of silica nanoparticles in ethanol and water mixture.

FIGS. 1.4A and 1.4B illustrate a two-sided specular reflection (FIG. 1.4A) and transmission (FIG. 1.4B) spectra comparing the effect of varying the coating times.

FIGS. 1.5A-1.5F illustrate two-sided specular reflection (FIG. 1.5A, 1.5C, 1.5E) and transmission (FIG. 1.5B, 1.5D. 1.5F) spectra comparing the uniformity of the coatings prepared with different coating times. (FIGS. 1.5A and 1.5B: 15 s) (FIGS. 1.5C and 1.5D: 30 min.) (FIGS. 1.5E and 1.5F: 90 min.)

FIGS. 1.6A and 1.6B illustrate the summary of the average two-sided reflection (FIG. 1.6A) and transmission (FIG. 1.6B) values at 600 nm wavelength for nanoparticle coatings prepared with different coating times.

FIGS. 1.7A to 1.7D illustrate typical top-view SEM images showing surface area coverage achieved by 110 nm silica nanoparticles for different coating times. (FIG. 1.7A: 15 s.) (FIG. 1.7B: 5 min.) (FIG. 1.7C: 30 min.) (FIG. 1.7D: 90 min.)

FIG. 1.8 illustrates the average nanoparticle surface area coverage for coatings prepared with different coating times.

FIG. 1.9 illustrates a photograph comparing the anti-glare properties of an uncoated (top) and a nanoparticle-coated (bottom) glass substrate (5×5 inch in size).

FIG. 1.10 illustrates a schematic illustration of the experimental setup used to parallelly coat multiple glass samples. FIGS. 1.11A and 1.11B illustrates a specular reflection and transmission spectra obtained from 3 simultaneously coated samples.

FIG. 1.12 shows four different silicon substrates, half of each silicon substrate is coated with different sized particles and the other half is etched.

FIG. 1.13 shows a 45 degree tilted view of the pillars that are formed.

FIG. 1.14 illustrates the reflectance spectra of the moth-eye pillar structures generated by the different sized silica particles.

DETAILED DESCRIPTION

This disclosure is not limited to particular embodiments described, and as such may, of course, vary. The terminology used herein serves the purpose of describing particular embodiments only, and is not intended to be limiting, since the scope of the present disclosure will be limited only by the appended claims.

Where a range of values is provided, each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Embodiments of the present disclosure will employ, unless otherwise indicated, techniques of chemistry, material science, and the like, which are within the skill of the art. Such techniques are explained fully in the literature.

The following examples are put forth so as to provide those of ordinary skill in the art with a complete disclosure and description of how to perform the methods and use the structures disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, dimensions, frequency ranges, applications, or the like, as such can vary. It is also to be understood that the terminology used herein is for purposes of describing particular embodiments only, and is not intended to be limiting. It is also possible in the present disclosure that steps can be executed in different sequence, where this is logically possible. It is also possible that the embodiments of the present disclosure can be applied to additional embodiments involving measurements beyond the examples described herein, which are not intended to be limiting. It is furthermore possible that the embodiments of the present disclosure can be combined or integrated with other measurement techniques beyond the examples described herein, which are not intended to be limiting.

It should be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DISCUSSION

Embodiments of the present disclosure provide for methods of making substrates having an antireflective layer, substrates having an antireflective layer, devices including a substrate having an antireflective layer, and the like. Embodiments of the present disclosure provide for substrates that have high quality antireflection coatings that are uniform and have excellent antireflection properties. In particular, substrates of the present disclosure have light reflection properties and light transmission properties that are superior to currently used antireflective substrates. Embodiments of the present disclosure are advantageous in that the method is simple, inexpensive, and scalable, unlike other competing technologies. Embodiments of the substrate can be used in solar cells, photovoltaic cells, organic light emitting diodes (OLEDs), optical lenses, photodiodes, flat panel displays, semiconductor light emitting diodes, and the like.

Embodiments of the present disclosure provide for an electrostatics-assisted colloidal self-assembly technology for fabricating monolayer nanoparticle anti-glare coatings over large areas. This approach can be based on the electrostatic adsorption of negatively charged silica nanoparticles on surface-functionalized glass substrates with positive surface charges. This technology could enable simultaneous coating of both sides of glass substrates with complex geometries and is inherently parallel for potential large-scale fabrication of inexpensive anti-glare coatings with high coating quality and reproducibility. By combining experiments with theoretical simulations, embodiments of the present disclosure have been systematically examined the critical parameters that significantly affect the anti-glare performance of the self-assembled nanoparticle coatings. It was found that the theoretical optimum nanoparticle surface area coverage (e.g., about 60%) was readily achievable using embodiments of the present disclosure.

Embodiments of the present disclosure provide for a simple, inherently parallel, and scalable bottom-up approach for fabricating nanoparticle anti-glare coatings on large glass substrates. Negatively charged silica nanoparticles can be electrostatically adsorbed onto a surface-functionalized glass substrate with positive surface charges to form a disordered monolayer nanoparticle coating. Systematic experiments have been conducted to optimize the parameters, such as the dispersing dielectric medium, nanoparticle concentration of the colloidal suspension, and the coating time, that affect the uniformity and the anti-glare properties of the final coatings. Specular reflection and transmission measurements demonstrate that good anti-glare performance (with <1% two-sided reflection) and high optical transmission (>99%) can be achieved by the self-assembled nanoparticle coatings of the present disclosure. In an embodiment, methods can be used to simultaneously coat multiple 5-in.-sized glass substrates with high and reproducible qualities.

In an exemplary embodiment, the method of forming an antireflective layer on a substrate includes forming (e.g., self-assembled), simultaneously, a colloidal monolayer of particles (e.g., silica) on the front and back surface of a substrate. In an embodiment, the nanoparticles can be attached to the surface of the substrate via electrostatic attraction. In particular, a substrate is disposed in a solution that is exposed to constant mixing (e.g., shaking) during exposure of the substrate to the solution. In an embodiment, shaking the solution continuously during exposure can prevent sedimentation and also ensures constant movement of the nanoparticles in the solution so that they can absorb on the empty surfaces of the substrate. In an embodiment, the shaking can be produced using sonication, mechanical shaking, magnetic stirring, hand shaking, or a combination thereof.

In an embodiment, the substrate can be exposed to the solution for about 10 sec to 120 min, about 30 min to 120 min, about 60 min to 120 min, or about 90 min. In an embodiment, the solution can be exposed to shaking for about 10 sec to 120 min, about 30 min to 120 min, about 60 min to 120 min, or about 90 min.

After exposure to the solution, the coated substrate can be rinsed to remove any unbound nanoparticles to the front side and the back side. For example, the coated substrate can be exposed to a solvent (e.g., ethanol or another alcohol) and then allowed to air dry.

In an embodiment, the nanoparticles can be disposed on the substrate as an ordered colloidal monolayer (e.g., a hexagonal ordering). In an embodiment, the light reflected is about 0.5 to 4% over a wavelength of about 400 nm to 800 nm for the coated substrate. In an embodiment, the light reflected is about 14% for a wavelength of about 550 nm for the coated substrate. In an embodiment, the light transmission is about 99% or more over a wavelength of about 500 to 650 nm for the coated substrate. In an embodiment, the coated substrate has both the light reflected property and the light transmission property.

In an exemplary embodiment, the substrate can include a silicon substrate, a gallium arsenide (GaAs) substrate, a gallium antimonide (GaSb) substrate, indium phosphide (InP), gallium nitride (GaN), sapphire, and the like. In an embodiment, the silicon substrate can include a single crystal silicon substrate, a multi-crystalline substrate, or an amorphous silicon substrate. In an embodiment, the substrate can have a thickness of about 2 µm to 1000 µm and the length and width can vary depending upon the desired use or application.

In an embodiment, the substrate can have a front and back side that is functionalized to have a net negative charge. In an embodiment, the surface can be functionalized by attaching a functional group that imparts a net positive charge to the surface of the substrate. In an embodiment, the functional group can include an amino group, sulfate group, phosphate group, or a combination thereof. The Examples provide additional details.

In an embodiment, the solution can include nanoparticles. In an embodiment, the nanoparticle can be a silica nanoparticle, polystyrene nanoparticle, titania nanoparticle, alumina nanoparticle, gold nanoparticles, silver nanoparticles, or iron oxide nanoparticles. In an embodiment, the nanoparticle can be a silica nanoparticle. In an embodiment, the nanoparticle can have a geometric shape of a sphere. In an embodiment, the nanoparticle can have a diameter of about 50 to 500 nm, about 50 to 300 nm, about 50 to 250 nm, or about 100 to 200 nm. In an embodiment, the mass fraction of nanoparticles present in the solution can be about 1 to 5% or about 1 to 2%, or about 1.6%.

In an embodiment, the solution includes a solvent and water. In an embodiment, the solvent can include methanol, ethanol, isopropanol, acetone, or a combination thereof. In an embodiment, the solvent can be ethanol. In an embodiment, the ratio of solvent to water can be about 80 to 95% by volume of solvent and about 5 to 20% by volume of water, about 85 to 95% by volume solvent and about 5 to 15% by volume of water, or about 90% by volume solvent and about 10% by volume of water. In a particular embodiment, the ratio of ethanol to water can be about 90% by volume ethanol and about 10% by volume of water.

In a particular embodiment, once the coated substrate is formed, the coated substrate can be etched to form another type of antireflective layer on the substrate. In an exemplary embodiment, the etching can include a reactive ion etching process. The nanoparticles on the coated substrate are selected so that they are etched at a slower rate or are not etched at all relative to the substrate. In other words, the exposed areas of the substrate are etched and the areas under the nanoparticles are not etched. The etching process forms an antireflective layer. The conditions (e.g., temperature, chemical reactants, pressure, etc.) of the etching process can be adjusted to modify the physical characteristics (e.g., thickness of the antireflective layer, one or more dimensions of the pillars that form the antireflective layer, and the like) of the antireflective layer. Additional details regarding the etching process are described in the Example.

After the substrate is etched, the nanoparticles can be removed from the surface of the coated substrate to form substrate A having an antireflective layer made of the substrate material. In an embodiment, the nanoparticles can be removed using an acid (e.g., hydrofluoric acid) treatment. Other methods that can be used include ultrasonication, scratching, or a combination thereof.

In an embodiment, the antireflective layer can be referred to as a moth-eye grating. In an embodiment, the antireflective layer has a total specular reflection of about 2% or less, about 1%, or less, or about 0.5% or less, for the entire visible wavelength at an incident angle of about 0° to 90°. The phrase "total specular reflection" means the overall specular reflection obtained from a substrate surface with reflection angle between 0 and 90°. An integration sphere can be used in measuring total specular reflection.

In an exemplary embodiment of substrate A, the antireflective layer has a height (or depth of the etched structure) of about 500 nm to 2000 nm or about 500 nm to 1000 nm. In an embodiment, the removal of the substrate below the particles to form pillars made of the substrate material. In an embodiment, the pillars can have a spacing of about 10 nm to 300 nm between a pair of pillars as measured from the pillar base to pillar base, where the spacing can vary between multiple pairs of pillars.

In an embodiment, the pillar can have a diameter at the base of about 50 to 300 nm or about 50 to 150 nm. The pillar may have the same or different diameter along the length of the pillar. In an embodiment, the pillar tapers from the base to the top of the pillar, where the diameter of the pillar at the midpoint of the length of the pillar can be about 50 nm to 300 nm or about 50 to 150 nm.

In an embodiment, the pillar can have a length or height of about 100 to 2000 nm or about 100 nm to 1000 nm. In an embodiment, the length of the pillars can vary depending on the surface morphology of the substrate so that some pillars are much longer than others. For example, the length of the pillars can vary significantly in a multi-crystalline silicon substrate due to the surface morphology. Thus, the length of each of the pillars in the antireflective layer can vary widely.

While embodiments of the present disclosure are described in connection with the Example and the corresponding text and figures, there is no intent to limit the disclosure to the embodiments in these descriptions. On the contrary, the intent is to cover all alternatives, modifications, and equivalents included within the spirit and scope of embodiments of the present disclosure.

Example 1

When light is incident upon a surface, due to its wavelike properties some of the light gets reflected and some gets transmitted through the surface. Reflection occurs because of the difference in the refractive index of the two mediums that the light is propagating through. In order to reduce reflection, antireflection coatings are utilized. Antireflection coatings are used in a wide variety of applications where it is critical to keep the amount of light reflected to a bare minimum. Photovoltaic devices trap the incoming sunlight and convert it to energy therefore antireflection coatings is a key component in maximizing the conversion efficiency of these devices. Current antireflection coating technologies used on PV's and other optoelectronic devices are quarter-wavelength antireflection coatings that are fabricated by using expensive vapor deposition processes that require high vacuum and have a low throughput. Additionally, these coatings can only suppress reflection effectively around a single wavelength (usually around 600 nm) and at all other wavelengths the amount of light reflected is significantly increased. These coatings also can only be applied to a single side at a time thus making them inefficient and time consuming. Alternatively, solution processing antireflection coatings such as nanoporous coatings and self-assembly of nanoparticles and polyelectrolyte multilayer are more cost effective. Unfortunately these methods involve multiple steps and are more complex to implement. In addition, these methods are limited to single sided coatings, the coatings achieved are not very uniform and they take a long time to develop. Therefore these processes can't be scaled up and used in industry to fabricate PV's and other optoelectronic devices.

Embodiments of the present disclosure are based on colloidal self-assembly on functionalized substrates to generate broadband antireflection coatings. The principle of the method is to first immerse glass substrates in a piranha solution ($H_2SO_4$:$H_2O_2$ in a 4:1 ratio) at 70° C. for 90 minutes to clean organic residues off the substrate and hydroxylate the surface. The glass substrates are then immediately rinsed with DI (De-ionized) water followed by ethanol and are air dried. The next step involves functionalizing the surface of the glass substrates with an amino group to make the net surface charge of the glass substrates positive. This is achieved by immersing the clean glass slides into a (3-aminopropyl)triethoxysilane:toluene solution in a 1:40 ratio for 2 hours. The functionalized glass substrates are then rinsed in toluene and are air dried. Rinsing the glass substrates in toluene after the functionalization step is performed to remove any unadsorbed APS molecules from the surface. Silica nanoparticles were dispersed in an ethanol and water mixture (90% ethanol and 10% water by volume) ensuring the mass fraction of the silica nanoparticles to be around 2%. The glass substrates were then placed into the silica nanoparticle suspension for 90 minutes while continuously shaking the silica nanoparticle suspension. Electrostatic attraction between the negatively charged silica particles and the positively charged glass substrates will result in a very uniform double sided coating of the glass substrates with a monolayer of silica nanoparticles. The shaking prevents sedimentation effects of the silica nanoparticles onto the surface of the glass substrates. The coated glass slides were dipped immediately in a solution of ethanol and water with similar composition as used with the silica nanoparticles. The coated glass slides were then rinsed with ethanol and air dried. Rinsing the glass slides with ethanol and water solution followed by pure ethanol is carried out in order to get rid of any excess silica particles that are not electrostatically adsorbed onto the glass slide surface.

The glass slides were coated with 100 nm silica particles. The observed coating appeared to be very uniform and was blue in color. The glass slides were coated evenly on both sides and no defects seem to have been present. A comparison between an uncoated glass slide and a coated glass slide can be seen in FIG. 1.1. It was clear that the coating applied on the glass slide considerably reduced the amount of light being reflected, thus no glare can be seen.

Optical measurements were conducted to measure the amount of light reflected and transmitted through the glass substrate. The optical measurements were conducted by using a light probe to shine light directly normal to the substrate surface and measuring the amount of light reflected and transmitted. FIG. 1.2 shows the measured normal incidence reflection spectra and the normal incidence transmission spectra. For an uncoated glass slide, about 8.5% of light gets reflected. On the other hand, for the coated glass slide the amount of light reflected varies depending on the wavelength. For wavelengths in the visible spectrum (400 nm-790 nm) range, the amount of light reflected ranges from 1% to about 3.5% with a minimum of 1% at around 550 nm. The coated glass slide also shows a tremendous improvement in the amount of light transmitted through the substrate. The coating improves transmission of light from about 92% for a uncoated glass to about 99% after coating.

The major factors that were determined to affect the quality and the optical properties of the coating are the shaking of the silica nanoparticles suspension during the coating, the mass fraction of silica nanoparticles in the ethanol and water mixture and the coating time. Varying other factors such as the APS concentration and the duration of immersing the glass slides in the APS solution didn't have a significant effect on either the quality or the optical properties of the coated glass slides since the next step involves rinsing the glass slides in a toluene solution thus removing all the excess APS from the glass surface.

Shaking the silica nanoparticles suspension during the coating process prevents sedimentation effects and also ensures the constant movement of the silica nanoparticles within the suspension. It is important for the silica nanoparticles to be in constant motion to allow for a uniform self-assembly of the silica nanoparticles onto the surface of the glass slide. In addition the constant movement helps the silica nanoparticles to electrostatically adsorb onto any empty spaces thus increasing the particle coverage of the sample and lowering defects.

Changing the mass fraction of silica nanoparticles in ethanol and water mixture plays a major role in controlling the particle coverage on the glass slide which in turn governs the optical properties of the coating. Experiments have been conducted studying this effect with silica nanoparticle mass fractions being 1.6, 4.2 and 16.7. After coating the glass slides, silica nanoparticles mass fraction of 1.6 coating looked very uniform and was purplish blue in color. The silica nanoparticles mass fraction of 4.2 coating was also very uniform and was more blue in color. As for the silica nanoparticles mass fraction of 16.7, the coating was also very uniform but it was apparent that multilayer coatings were present from the yellowish color of the coating. The optical properties were measured and compared in FIG. 1.3. By observing the optical spectrum it is apparent that the best coating resulted from silica nanoparticles suspension with mass fraction of 1.6% in ethanol and water mixture.

The coating time is the major factor that affects the coating uniformity of the sample. Enough time needs to be given for the moving silica nanoparticles in the solution to self-assemble onto the surface of the glass. The coating time also affects the optical properties of the coating. Different coating times were investigated and optical measurements were conducted as can be seen in FIG. 1.4. It can be seen that the longer the coating time the better the antireflection properties of the coating. The uniformity of the coating was then tested by picking a short coating time sample, a medium coating time sample and a long coating time sample. 10 random regions on the glass slides were chosen and optical measurements were conducted to see if they will produce the same optical readings. FIG. 1.5 demonstrates our results for the uniformity test for the 3 samples.

The results demonstrated in FIG. 1.5 show that for longer coating times the uniformity of the coating greatly improves. A summary of the coating uniformity test can be seen in FIG. 1.6.

SEM images were taken for each sample at different coating times to study the particle surface area coverage of the coating. SEM images of 15 seconds, 5 minutes, 30 minutes and 90 minutes coating times are shown in FIG. 1.7. It can be seen that as the coating time increases, the surface area coverage also increases. The 100 nm silica nanoparticles are randomly arranged on the surface forming a non-close packed colloidal monolayer. Another noticeable feature is that some defects start to appear as the coating time increases. These defects could be minimized by increasing the amount of time the samples are rinsed in ethanol and water thus ensuring the removal of any loosely adhered particles. Longer rinsing in water and ethanol won't affect the particles directly adhered to the functionalized surface of the substrate via electrostatic interaction.

Using the SEM images and a sophisticated computer software for analyzing pictures, we were able to estimate the particle surface area coverage achieved for the different coating times. Multiple SEM pictures were taken from different locations on each sample and were inputted into the computer software. The computer system then separates the particles from the empty regions by differentiating their colors and then it provides us with information regarding the particle surface area coverage for each SEM image. The data was then averaged and plotted with error analysis as can be seen in FIG. 1.8. It can be seen that for samples coated with silica particles for less than 5 minutes, the particle surface area coverage remains almost constant around 32%. On the other hand, there is a linear increase in particle surface area coverage for samples coated between 5 minutes and 60 minutes, going from 32% to 60%. Increasing the coating time beyond 60 minutes barely changes the surface area coverage.

The coating experiments conducted on glass substrates have shown that the optimum conditions to generate high quality and uniformity coatings is to use silica particle mass fraction of 1.6% and to coat the glass substrates for 90 minutes. Using the optimum condition, it was also possible to coat larger glass substrates with no problems. FIG. 1.9 shows a 5 inch×5 inch glass substrate coated with 100 nm silica particles. It is clear from the picture that the coated glass substrate exhibits antiglare properties.

In addition to the flexibility of easily coating larger substrates, the disclosed coating technique can coat multiple substrates easily. FIG. 1.10 shows the experimental setup that was used to test the quality of the coating achieved by coating 3 glass substrates simultaneously with 100 nm silica particles. One glass slide was placed on the left, one in the middle and one on the right as shown in the figure. FIG. 1.11 shows the optical properties of the 3 coated glass substrates. All 3 coated glass substrates exhibit similar antireflection properties, thus demonstrating that this coating method could be scaled up to coat multiple substrates all at once.

The disclosed technology for coating using electrostatically driven self-assembly of nanoparticles has been shown to be a simple and efficient method for producing antireflection coatings on glass substrates. The novel technology is not only limited to coating glass substrates, it can be extended to coating other substrates also. Silicon constitutes as one of the major components used in the manufacturing of photovoltaic's and semiconductors due to its low cost and its abundance. Therefore it is important to find cheap methods of making the surface of silicon antireflective. Using the coating technology disclosed, we have easily managed to coat silicon wafers with 100 nm, 200 nm, 300 nm and 400 nm silica particles. To further enhance the antireflective properties of the silicon wafer surface, the coated silica particles were used as an etching mask for a chlorine reactive ion etching process to fabricate moth-eye antireflection nanopillars. The etching conditions were 5 mTorr pressure, 20 SCCM chlorine flow rate, and 80 W. All the silicon wafers were etched for 30 minutes. Following the etching, the silicon wafers were dipped into 2% hydrofluoric acid to remove all the silica particles. An experiment was conducted where all the etching conditions (time, power, pressure and flow rates) were held constants while different size silica particles were used to allow for the fabrication of different geometries of motheye pillar arrays. FIG. 1.12 shows four different silicon substrates, half of each silicon substrate is coated with different sized particles and the other half is etched. The etched half is completely black in color thus showing extremely good antireflection properties.

FIG. 1.13 shows a 45 degree tilted view of the pillars that are formed. These images give a better idea of the different morphologies that are generated by the different size of particles used as an etch mask. Larger particles generate more cylindrical pillars, while pillars formed with smaller particles have a more conical tip. This is due to smaller silica particles being etched away more quickly leaving more of the silicon pillar tips exposed to the chlorine ions. The pillar heights for the different sized silica particles under the same etching conditions were about the same, around 1 μm. The 100 nm particles etch away faster resulting in undercutting the pillars directly underneath the particles. This undercutting and over-etching can result in pillar collapse. Larger particles used as a etch mask will have a lower surface area to volume ratio thus allowing for a better protection against undercutting, thus generating more uniform pillar heights and shape.

The reflectance spectra of the moth-eye pillar structures generated by the different sized silica particles are shown in FIG. 1.14. The 100 nm and 200 nm samples show really good broadband antireflection properties with a reflection of about 0.1% for 100 nm samples and reflection of about 0.3% for 200 nm samples. On the other hand 300 nm samples and 400 nm samples have much higher reflection. This could be attributed to the different shape and width of the pillars of 300 nm and 400 nm samples compared to 100 nm and 200 nm samples. The more conical the shape of the pillar the lower the refractive index contrast thus generating a smooth transition of refractive index from that of air to silicon. The cylindrical pillars will have a higher refractive index contrast thus explaining why the pillars generated by larger particles have higher reflection.

We have demonstrated that using the electrostatically driven self-assembly of nanoparticles in generating antireflection coatings is very simple to implement and extremely cheap. Antireflection coatings on both sides of the glass and silicon substrates were easily produced. The major factors affecting this process can easily be controlled. Furthermore, we have shown that by using the self-assembled nanoparticles as etching templates, broadband antireflection coatings on silicon could be generated. This coating technique could potentially be scaled up to being an industrial process by facilitating the generation of antireflection coatings on PV's and other optoelectronic devices.

REFERENCES

[1] S. Walheim, E. Schäffer, J. Mlynek, U. Steiner, Science 283 (1999) 520.
[2] A. Gombert, W. Glaubitt, K. Rose, J. Dreibholz, B. Blasi, A. Heinzel, D. Sporn, W. Döll, V. Wittwer, Thin Solid Films 351 (1999) 73.
[3] C. Heine, R. H. Morf, Appl. Opt. 34 (1995) 2476.
[4] M. Ibn-Elhaj, M. Schadt, Nature 410 (2001) 796.
[5] A. Gombert, B. Blasi, C. Buhler, P. Nitz, J. Mick, W. Hossfeld, M. Niggemann, Opt. Eng. 43 (2004) 2525.
[6] J. A. Hiller, J. D. Mendelsohn, M. F. Rubner, Nat. Mater. 1 (2002) 59.
[7] U. Schulz, Appl. Opt. 45 (2006) 1608.
[8] B. E. Yoldas, D. P. Partlow, Thin Solid Films 129 (1985) 1.
[9] D. Chen, Sol. Energ. Mater. Sol. C. 68 (2001) 313.
[10] M. F. Schubert, F. W. Mont, S. Chhajed, D. J. Poxson, J. K. Kim, E. F. Schubert, Opt. Exp. 16 (2008) 5290.
[11] H. Nagel, A. Metz, R. Hezel, Sol. Energ. Mater. Sol. C. 65 (2001) 71.
[12] A. Luque, S. Hegedus, Handbook of Photovoltaic Science and Engineering. John Wiley & Sons, West Sussex, 2003.
[13] M. Sakhuja, J. Son, L. K. Verma, H. Yang, C. S. Bhatia, A. J. Danner, Prog. Photovol. 22 (2014) 356.
[14] H. A. Macleod, Thin-Film Optical Filters. Third ed., Institute of Physics Publishing, Bristol, 2001.
[15] C. M. Kennemore Iii, U. J. Gibson, Appl. Opt. 23 (1984) 3608.
[16] D. Lee, M. F. Rubner, R. E. Cohen, Nano Lett. 6 (2006) 2305.
[17] M. Kursawe, R. Anselmann, V. Hilarius, G. Pfaff, J. Sol-Gel Sci. Technol. 33 (2005) 71.
[18] Y. Zhao, J. S. Wang, G. Z. Mao, Opt. Lett. 30 (2005) 1885.
[19] D. Lee, Z. Gemici, M. F. Rubner, R. E. Cohen, Langmuir 23 (2007) 8833.
[20] K. Askar, B. M. Phillips, X. Dou, J. Lopez, C. Smith, B. Jiang, P. Jiang, Opt. Lett. 37 (2012) 4380.
[21] H. Shimomura, Z. Gemici, R. E. Cohen, M. F. Rubner, ACS Appl. Mater. Interface 2 (2010) 813.
[22] H. Y. Koo, D. K. Yi, S. J. Yoo, D. Y. Kim, Adv. Mater. 16 (2004) 274.
[23] T. Lohmueller, M. Helgert, M. Sundermann, R. Brunner, J. P. Spatz, Nano Lett. 8 (2008) 1429.
[24] M. S. Park, J. K. Kim, Langmuir 20 (2004) 5347.
[25] B.-T. Liu, Y.-T. Teng, R.-H. Lee, W.-C. Liaw, C.-H. Hsieh, Colloid Surf. A 389 (2011) 138.
[26] J. Q. Xi, M. F. Schubert, J. K. Kim, E. F. Schubert, M. Chen, S.-Y. Lin, LiuW, J. A. Smart, Nat. Photon. 1 (2007) 176.
[27] G. M. Nogueira, D. Banerjee, R. E. Cohen, M. F. Rubner, Langmuir 27 (2011) 7860.
[28] C. S. Thompson, R. A. Fleming, M. Zou, Sol Energ Mater Sol C 115 (2013) 108.
[29] G. Zhou, J. He, J. Nanosci. Nanotechnol. 13 (2013) 5534.
[30] J.-H. Kim, S. Fujita, S. Shiratori, Colloid Surf. A 284 (2006) 290.
[31] M. I. Dafinone, G. Feng, T. Brugarolas, K. E. Tettey, D. Lee, ACS Nano 5 (2011) 5078.
[32] B. G. Prevo, E. W. Hon, O. D. Velev, J. Mater. Chem. 17 (2007) 791.

[33] B. G. Prevo, O. D. Velev, Langmuir 20 (2004) 2099.
[34] H. Jiang, K. Yu, Y. C. Wang, Opt. Lett. 32 (2007) 575.
[35] B. T. Liu, W. D. Yeh, Thin Solid Films 518 (2010) 6015.
[36] B. T. Liu, W. D. Yeh, Colloid Surf. A 356 (2010) 145.
[37] A. Deak, I. Szekely, E. Kalman, Z. Keresztes, A. L. Kovacs, Z. Horvolgyi, Thin Solid Films 484 (2005) 310.
[38] A. Deak, B. Bancsi, A. L. Toth, A. L. Kovacs, Z. Horvolgyi, Colloid Surf. A 278 (2006) 10.
[39] K. M. Yeung, W. C. Luk, K. C. Tam, C. Y. Kwong, M. A. Tsai, H. C. Kuo, A. M. C. Ng, A. B. Djurisic, Sol Energ Mater Sol C 95 (2011) 699.
[40] X. Li, O. Niitsoo, A. Couzis, J. Colloid Interf. Sci. 394 (2013) 26.
[41] X. Li, O. Niitsoo, A. Couzis, J. Colloid Interf. Sci. 420 (2014) 50.
[42] H. Fudouzi, M. Kobayashi, N. Shinya, Langmuir 18 (2002) 7648.
[43] Y. Masuda, M. Itoh, T. Yonezawa, K. Koumoto, Langmuir 18 (2002) 4155.
[44] J. Tien, A. Terfort, G. M. Whitesides, Langmuir 13 (1997) 5349.
[45] S. Degand, G. Lamblin, C. C. Dupont-Gillain, J. Colloid Interf. Sci. 392 (2013) 219.
[46] J. Aizenberg, P. V. Braun, P. Wiltzius, Phys. Rev. Lett. 84 (2000) 2997.
[47] X. T. Zhang, O. Sato, M. Taguchi, Y. Einaga, T. Murakami, A. Fujishima, Chem. Mater. 17 (2005) 696.
[48] W. Stober, A. Fink, E. Bohn, J. Colloid Interf. Sci. 26 (1968) 62.
[49] S. P. Pack, N. K. Kamisetty, M. Nonogawa, K. C. Devarayapalli, K. Ohtani, K. Yamada, Y. Yoshida, T. Kodaki, K. Makino, Nucleic Acids Res. 35 (2007).
[50] M. G. Moharam, D. A. Pommet, E. B. Grann, T. K. Gaylord, J. Opt. Soc. Am. A 12 (1995) 1077.
[51] W. L. Min, B. Jiang, P. Jiang, Adv. Mater. 20 (2008) 3914.
[52] D. G. Stavenga, S. Foletti, G. Palasantzas, K. Arikawa, Proc. R. Soc. B 273 (2006) 661.
[53] E. Metwalli, D. Haines, O. Becker, S. Conzone, C. G. Pantano, J. Colloid Interf. Sci. 298 (2006) 825.
[54] S. Lu, A. Bansal, W. Soussou, T. W. Berger, A. Madhukar, Nano Lett. 6 (2006) 1977.
[55] W. B. Russel, D. A. Saville, W. R. Schowalter, Colloidal Dispersions. Cambridge University Press, Cambridge, 1989.
[56] B. T. Liu, Y. T. Teng, J. Colloid Interf. Sci. 350 (2010) 421.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

While only a few embodiments of the present disclosure have been shown and described herein, it will become apparent to those skilled in the art that various modifications and changes can be made in the present disclosure without departing from the spirit and scope of the present disclosure. All such modification and changes coming within the scope of the appended claims are intended to be carried out thereby.

We claim at least the following:

1. A method of forming an antireflective layer on a substrate, comprising:
    disposing a substrate in a solution, wherein a front side and a back side of the substrate are functionalized to form a functionalized surface having a net positive charge, wherein the solution is a colloidal suspension of silica nanoparticles;
    exposing the solution to shaking while the substrate is in the solution for about 30 min to 120 min; and
    forming, simultaneously, a coated substrate having a uniform monolayer of silica nanoparticles on the front side and the back side of the substrate through electrostatic attraction of the silica nanoparticles and the functionalized surfaces of the substrate while the substrate is within the solution, wherein the coated substrate has the characteristic about 0.5 to 4% light reflected over a wavelength of about 400 nm to 800 nm and the characteristic of about 99% or more light transmission over a wavelength of about 500 to 650 nm.

2. The method of claim 1, wherein the solution includes about 90% by volume ethanol and about 10% by volume of water.

3. The method of claim 2, wherein the solution includes a mass fraction of about 1% to 5% of silica nanoparticles.

4. The method of claim 2, wherein the solution includes a mass fraction of about 1.6% of silica nanoparticles.

5. The method of claim 1, wherein the silica nanoparticles have a diameter of about 100 to 200 nm.

6. The method of claim 1, wherein exposing is conducted for about 90 minutes.

7. The method of claim 1, wherein the substrate is selected from the group consisting of: a gallium arsenide (GaAs) substrate, a gallium antimonide (GaSb) substrate, indium phosphide (InP), and gallium nitride (GaN).

8. The method of claim 1, wherein the substrate is a silicon substrate.

9. A method of forming an antireflective layer on a substrate, comprising:
    disposing a substrate in a solution, wherein a front side and a back side of the substrate are functionalized to form a functionalized surface having a net positive charge, wherein the solution is a colloidal suspension of silica nanoparticles;
    exposing the solution to shaking while the substrate is in the solution for about 30 min to 120 min;
    forming, simultaneously, a coated substrate having a uniform monolayer of silica nanoparticles on the front side and the back side of the substrate through electrostatic attraction of the silica nanoparticles and the functionalized surfaces of the substrate while the substrate is within the solution; and
    etching the substrate to form an antireflective layer that has a height of about 500 nm to 2000 nm, wherein the antireflective layer includes a plurality of pillars that have a spacing of about 10 nm to 300 nm between a pair of pillars as measured from a pillar base to another pillar base of the pair of pillars, and wherein the pillars have a height of about 100 to 2000 nm.

10. The method of claim 9, wherein the pillars have a diameter at the base of about 50 to 300 nm.

11. The method of claim 9, wherein the pillars have different diameters along a length of the pillar.

12. The method of claim 11, wherein the pillars taper from a base to a top of the pillar, where a diameter of the pillar at a midpoint of the length of the pillar is about 50 nm to 300 nm.

13. The method of claim 9, further comprising a step of removing the silica nanoparticles.

14. The method of claim 9, wherein the substrate is selected from the group consisting of: a gallium arsenide (GaAs) substrate, a gallium antimonide (GaSb) substrate, indium phosphide (InP), and gallium nitride (GaN).

15. The method of claim 9, wherein the substrate is a silicon substrate.

* * * * *